United States Patent [19]

Lorenzen et al.

[11] Patent Number: 5,075,537
[45] Date of Patent: Dec. 24, 1991

[54] CONTROLLING AND MONITORING CIRCUIT FOR ELECTRICAL SEAT HEATING MEANS, ESPECIALLY OF AUTOMOTIVE VEHICLES

[75] Inventors: Günter Lorenzen, Olching; Bodo Ruthenberg, Munich, both of Fed. Rep. of Germany

[73] Assignee: Warme-undEletrotechn, Fed. Rep. of Germany

[21] Appl. No.: 458,681

[22] PCT Filed: May 30, 1989

[86] PCT No.: PCT/EP89/00608
§ 371 Date: Feb. 1, 1990
§ 102(e) Date: Feb. 1, 1990

[87] PCT Pub. No.: WO89/12268
PCT Pub. Date: Dec. 14, 1989

[30] Foreign Application Priority Data
Jun. 3, 1988 [DE] Fed. Rep. of Germany ....... 3818974

[51] Int. Cl.[5] .............................................. H05B 1/02
[52] U.S. Cl. .................................... 219/497; 219/202; 219/492; 219/501
[58] Field of Search .............................. 219/201–204, 219/494, 497, 499, 492, 501, 508, 510; 307/117

[56] References Cited

U.S. PATENT DOCUMENTS

| | | | |
|---|---|---|---|
| 3,789,190 | 1/1974 | Orosy et al. | 219/497 |
| 4,086,466 | 4/1978 | Scharlack | 219/497 |
| 4,399,781 | 8/1983 | Tsukasaki | 219/497 |
| 4,546,238 | 10/1985 | Ahs | 219/497 |
| 4,554,439 | 11/1985 | Cross et al. | 219/497 |
| 4,700,046 | 10/1987 | Fristedt | 219/202 |

FOREIGN PATENT DOCUMENTS

| | | |
|---|---|---|
| 0028794 | 5/1981 | European Pat. Off. . |
| 2309104 | 2/1973 | Fed. Rep. of Germany . |
| 2134340 | 8/1984 | United Kingdom . |

*Primary Examiner*—Mark H. Paschall
*Attorney, Agent, or Firm*—Shlesinger Fitzsimmons & Shlesinger

[57] ABSTRACT

Fast and highly sensitive monitoring of electrical resistance-type heating elements of seat heaters in automotive vehicles is achieved by short-time breaking of the power supply to the electrical resistance-type heating element and coupling the electrical resistance-type heating element during this interruption to an electrical measuring section for applying to the electrical resistance-type heating element a measuring current which is significantly lower than the heating current. A controlling and monitoring circuit operating in this way permits testing of the electrical resistance-type heating element for a plurality of types of faults within a wide range of operating conditions.

6 Claims, 2 Drawing Sheets

CONTROLLING AND MONITORING CIRCUIT FOR ELECTRICAL SEAT HEATING MEANS, ESPECIALLY OF AUTOMOTIVE VEHICLES

BACKGROUND OF THE INVENTION

The present invention is directed to controlling and monitoring circuits for electrical seat heating means, especially of automotive vehicles, comprising a control circuit including an electric heating element, a measuring section energized in response to the resistance of the electric heating element, and switching means controlled by the output from the measuring section for turning the electric heating element off.

With seat heating means which for example in the vicinity of the seat cover comprise electric heating elements formed by heating wires, which are provided on a substrate for example in a meander-like pattern, a zig-zag pattern or the like, short-circuits or interruptions of the heating wires may occur under load during use. Short-circuits which bridge certain sections of the length of the heating wire in the electrical resistance-type heating element of the seat heating means will result in increased current consumption and in the formation of hot spots on the heated seat or back rest; these faults cannot be detected by control circuits for controlling the power supply to the seat heating means when overheating occurs in areas of the electrical resistance-type heating element which are not thermally coupled to a temperature sensor of the control circuit.

To overcome these difficulties, the heating current through the electrical resistance-type heating element has already been monitored by a suitable measuring section which provides a signal causing the electrical heating element to be turned off when the heating current rises above a predetermined level, for example due to internal short-circuits within the seat heating means.

But such a monitoring circuit exhibits the drawback that the measuring section must be designed for the magnitude of the current flowing through the electrical resistance-type heating element in accordance with the respective heating capacity, or that in case of the electrical heating element being supplied with an a.c. current, relatively complex and expensive current transformers must be used for deriving a smaller measured current representative of the heating current.

Therefore the invention is intended to provide a controlling and monitoring circuit for electrical seat heating means of the specified kind in such a way that any faults of the electrical resistance-type heating element, especially internal short-circuits resulting in local overheating, can be detected reliably and extremely fast in a simple monitoring circuit which operates with very small measuring currents and causes the seat heating means to be turned off. Such a controlling and monitoring circuit is intended to respond to a multiplicity of conceivable faults of the electrical seat heating means and to sense such faults within a wide range of operating conditions.

SUMMARY OF THE INVENTION

In accordance with the invention the specified object is solved by a switch arrangement which is disposed in the power supply line to the electrical resistance-type heating element for short-time breaking of the connection between the electrical resistance-type heating element and the power supply source and for the substantially simultaneous short-time making of the connection between the electrical heating element and the measuring section which applies a measuring current to said element.

While it has been known per se in other fields to test a circuit in the intervals of normal operation, it is provided in the presently specified controlling and monitoring circuit for electrical seat heating means to perform short-time interruption of the power supply to the electrical resistance-type heating element during those periods in which the thermostatically ON-OFF-controlled electrical resistance-type heating element is ON. Due to the thermal inertia of the entire system, the short-time interruptions of the power supply to the electrical resistance-type heating element are practically insignificant, and moreover they are negligible also on account of the ratio between the short-time interruption period and the period of the energizing cycle in the case of thermostatic ON-OFF control, such ratio being in the order of magnitude of 1/500, for example.

Moreover it is important that it is possible in the presently specified measuring section, which is active during the short-time breaking of the power supply to the electrical resistance-type heating element, to provide reference voltage sources the reference voltages of which behave similarly to the voltage drop at the electrical resistance-type heating element due to the measuring current at various different operating states of the faultless electrical resistance-type heating element directly on putting it into operation, in case of greatly varying external temperatures, during heating-up, and the like.

For the rest, advantageous developments and improvements of the presently specified controlling and monitoring circuit are characterized in the patent claims which are dependent on claim 1. An embodiment of the invention will be explained below with reference to the drawing, in which:

THE DRAWINGS

FIG. 1 is a schematic circuit diagram of a controlling and monitoring circuit for electrical seat heating means, especially of automotive vehicles, in accordance with the here specified circuit layout, FIG. 2 corresponding time charts of the temperature of the electrical heating element and of the electric power supplied to the electrical heating element for thermostatic ON-OFF control, respectively, and FIG. 3 a time chart drawn to a greatly enlarged time scale of the supply voltage applied to the electrical heating element during a time III—III of FIG. 2.

DETAILED DESCRIPTION OF THE PREFERRED EMBODIMENTS

Figure 1:
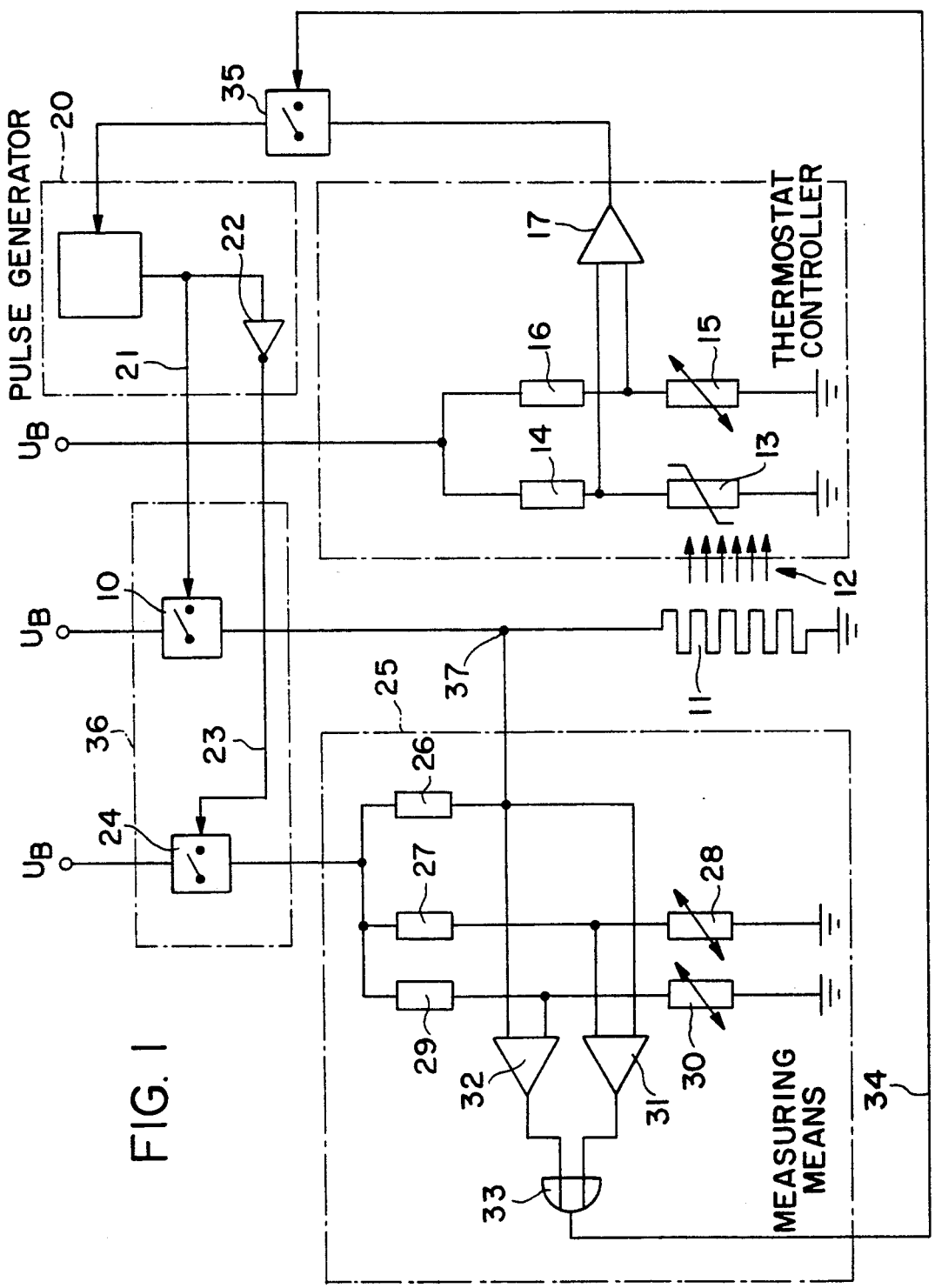

The circuit arrangement illustrated in FIG. 1 can be supplied with the vehicle voltage at the terminals $U_B$ via fusible links and a manually operated switch which may be mounted on the instrument panel of an automotive vehicle. An electrical resistance-type heating element 11 of the electrical seat heating means can be connected to the vehicle voltage through a switch 10, which may be configured as a power switching transistor with integrated thermal protection. The electrical resistance-type heating element 11 may be disposed either only in the seat upholstery or only in the back rest upholstery or may even be formed of heating element sections disposed both in the back rest and in the seat upholstery.

Of course, controlling and monitoring circuits of the presently specified kind may also be provided separately for an electrical resistance-type heating element for the seat upholstery and an electrical resistance-type heating element for the back rest, respectively, in such a way that during normal heating operation the electrical resistance-type heating element of the seat upholstery and the electrical heating element of the back rest can be selectively turned on separately or can be operated in series or in parallel, while for testing the faultless operation of the electrical resistance-type heating elements the latter are separately supplied with and tested by a measuring current provided by the measuring section, which will be described in detail below.

A temperature sensing resistor 13 is thermally coupled to the electrical resistance-type heating element as indicated by the arrows 12, the resistance of said sensing resistor varying in response to the temperature of the resistor 13 due to the thermal coupling with the electrical resistance-type heating element 11. The temperature sensing resistor 13 is part of a voltage divider, which additionally comprises the resistor 14 and is coupled to the vehicle power supply when the seat heating means is activated. The divider voltage of the voltage divider formed of the resistors 13 and 14 is compared with a reference voltage derived from a voltage divider composed of the resistors 15 and 16. This reference voltage can be varied by means of the variable resistor 15. It is therefore possible to provide at the resistor 15 a set-point value for thermostatic ON-OFF control.

Figure 2:
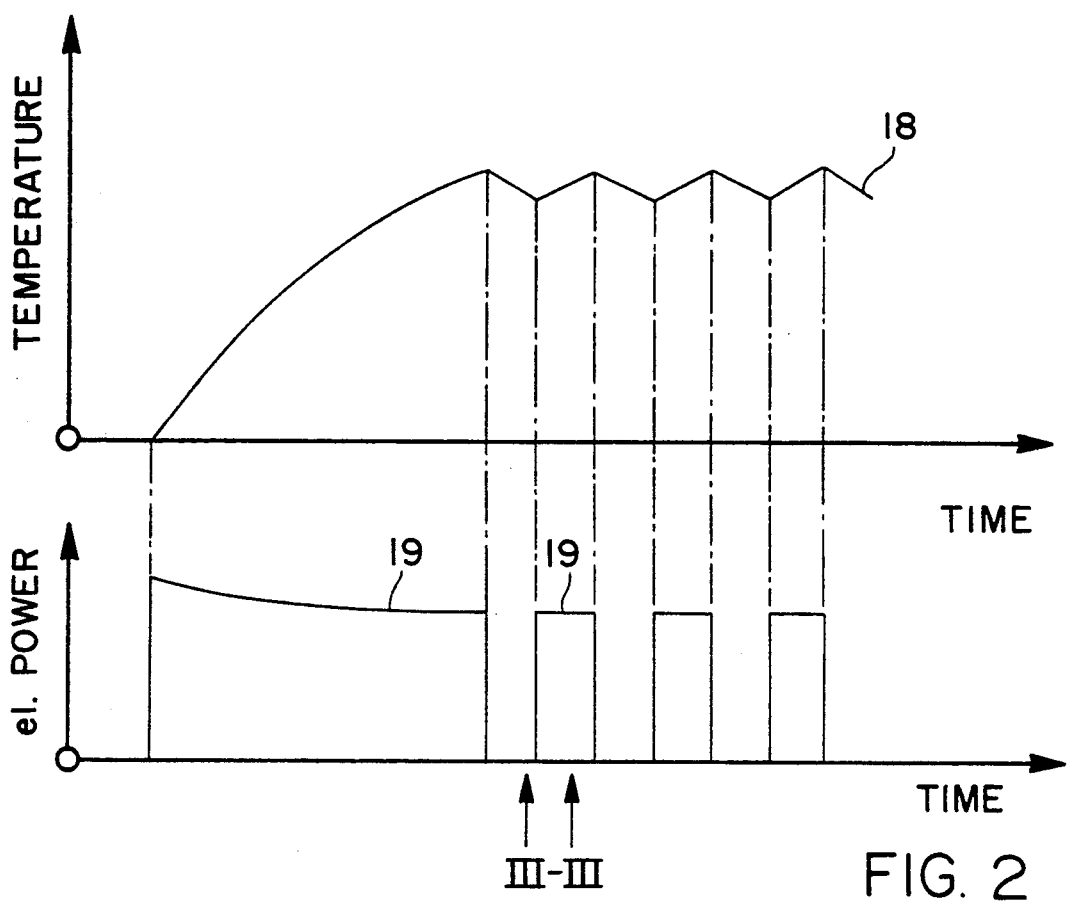

The divider voltages of the voltage dividers composed of the resistors 13 and 14, on the one hand, and 15 and 16, on the other hand, are compared with each other in the comparator 17, and the output from the comparator 17 is passed via a circuit connection to the switch 10 to cause the same to break the connection between the electrical resistance-type heating element 11 and the vehicle voltage when the temperature sensed by the sensing resistor 13 exceeds a set-point value, whereas the connection between the electrical resistance-type heating element 11 and the vehicle voltage is made again by the switch 10 when the temperature sensing resistor 13 senses dropping of the heating temperature below the set-point value. Due to the hysteresis inherent in the control system, the characteristics 18 and 19 of FIG. 2 relating to the temperature of the electrical resistance-type heating element 11 and the supplied electric power, respectively, will result as a function of time.

At an operating condition of the embodiment illustrated in FIG. 1 which requires coupling of the electrical resistance-type heating element 11 to the vehicle voltage and therefore the supply of heating power, the output signal from the comparator 17 causes a pulse generator 20 to provide on an output line 21 control pulses of a respective period of 1.997 s, separated by pulse intervals of 0.003 s. The control pulses on line 21 cause the switch 10 to couple the electrical resistance-type heating element 11 to the vehicle voltage for respective pulse trains of a period of 1.997 s, separated by pulse intervals of 0.003 s (the specified periods of time are only mentioned as examples!), as long as the comparator 17 provides an output signal representative of a temperature of the electrical resistance-type heating element below the set-point temperature. Such an output from the comparator 17 may have a period of 60 s during a heating-up phase after the seat heating means has been activated while thereafter, following heating pauses of about 6 s, it may last for short heating times having a respective period of 6 s, too. But the specified times merely are an example for illustrating the principal relationships, so that the time charts of FIG. 2 should be understood only qualitatively and do not include any scaling data.

The output signal from the pulse generator 20 provided on line 21 is inverted in the inverting element 22 and is provided via line 23 to a switch 24 which is controlled by the signal on line 23 and has the function of coupling the vehicle voltage to a measuring section 25 for a short time during the pulse intervals of the signal on line 21 in response to the signal on line 23.

The measuring section 25 comprises a resistor 26 which together with the electrical resistance-type heating element 11 constitutes a voltage divider coupled to the vehicle voltage when the switch 10 has broken the direct connection between the electrical resistance-type heating element 11 and the vehicle voltage. The divider voltage which can be derived from the voltage divider composed of the resistor 26 and the electrical resistance-type heating element 11 is compared with the voltages from two reference voltage sources, wherein the first reference voltage source is composed of a resistor 27 and a variable resistor 28, while the second reference voltage source is composed of a voltage divider formed of the resistor 29 and a variable resistor 30.

The comparator 31 outputs a fault indicating signal when during operation of the electrical resistance-type heating element 11 the resistance thereof due to internal short-circuits drops below a predetermined set-point value adjusted at the resistor 28, while the comparator 32 outputs a fault indicating signal when the resistance of the electrical resistance-type heating element 11 due to interruptions or cross-sectional constrictions rises above a predetermined value adjusted at the resistor 30. The outputs from the comparators 31 and 32 are combined in the OR-circuit 33 so that a fault indicating signal is provided on a line 34 as soon as the resistance of the electrical resistance-type heating element 11 is outside of a predetermined range window which can be selected by means of the resistors 28 and 30.

The fault indicating signal on line 34 is applied to a switch 35 for breaking the connection between the comparator 17 and the pulse generator 20 as soon as the fault indicating signal occurs, so that the pulse generator will not provide any control signals on line 21 causing the switch 10 to be turned ON; consequently the electrical resistance-type heating element 11 remains OFF.

Figure 3:
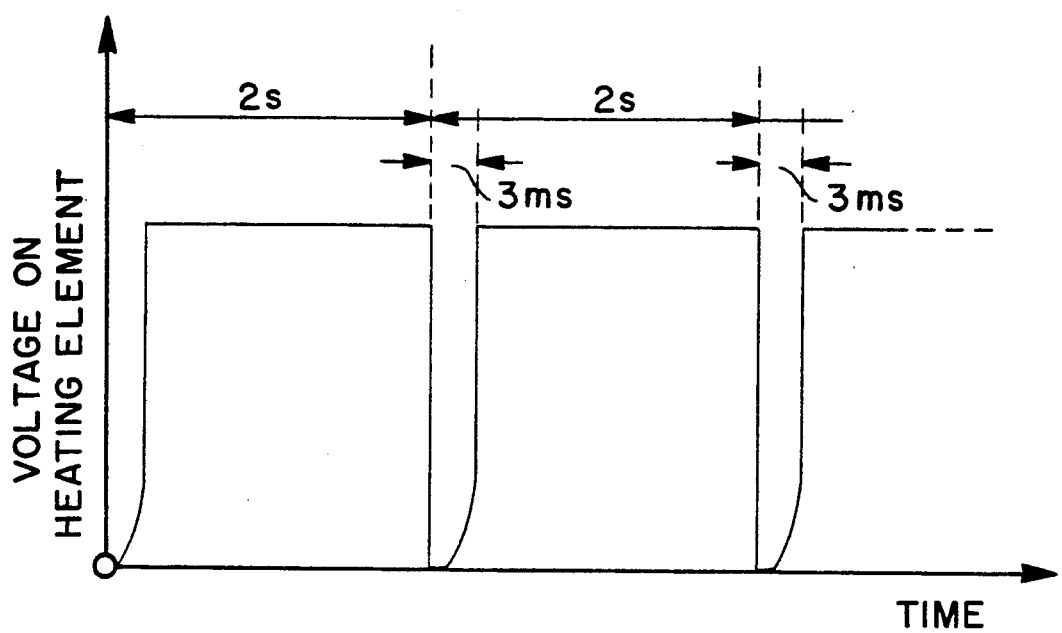

It will be apparent from FIG. 3 that the pulse intervals between the pulses on line 21 have a duration of, for example, only 3 ms; but this is sufficient for detecting the state of the electrical resistance-type heating element 11 by means of the measuring section 25. The time period of the characteristic of the supply voltage applied to the electrical resistance-type heating element during trouble-free operation, as illustrated in FIG. 3, corresponds to the relatively short period between the times III—III in the time chart of the electrical power illustrated in FIG. 2.

To the skilled person it will be apparent that the circuit arrangement illustrated in FIG. 1 may be modified in various ways. For instance, it is possible to provide a changeover switch at the tie point 37 to replace the switches 10 and 24 of the switch section 36 of FIG. 1, said changeover switch being controlled by the signals from the pulse generator 20 on line 21. In such a configuration of the circuit arrangement, the measuring section 25 remains constantly coupled to the vehicle voltage after activation of the device. Also, the output signals from the measuring section and the thermostatic control section may be directly supplied to the pulse generator 20 for logic combination.

We claim:

1. A controlling circuit for the heating current of electrical seat heating means, especially for automative vehicles, comprising a heat current source ($U_B$) for the electrical resistance-type heating element (11), a measuring current source for supplying an essentially lower measuring current to the heating element (11), further comprising an interruption circuit (12-17, 35, 20, 21, 10) for the heating current, and a measuring section (25) for the resistance of the heating element (11) which includes comparator means (31, 32) for comparing the measured resistance signal of the heating element (11) with corresponding reference signals supplied from adjustable reference voltage sources (27, 28, 29, 30), and comprising a connection circuit (33) for supplying an output signal of the measuring means which depends on the said comparison, to an output line (34), a) wherein the output signal of the measuring means (25) is an error signal which switches off the seat heating means in the case of a defect, b) wherein a first reference voltage source (29, 30) supplies a first reference value corresponding to the short-circuit resistance of the heating element (11), c) wherein a second reference voltage source (27, 28) supplies a second reference value corresponding to an interruption of the heating element (11), d) wherein the connection circuit (33) is a OR circuit which supplies an interruption signal to the exit line (34), if an exit signal is present at one of both comparison means (31, 32) corresponding to a short-circuit or to an interruption of the heating element (11), e) wherein a resistance (13) which is dependent on the temperature, is provided in the area of the heating element (11), but is without electrical contact with this heating element, which resistance (13) is compared with an adjustable temperature reference value in a temperature comparator (17) for supplying a corresponding output signal, f) wherein the output signal of the temperature comparator (17) activates a pulse generator (20) to supply an input pulse to the switch (10) for supplying heating current, as long as this output signal is present and the temperature of the heating element (11) is below an adjusted reference value, g) wherein between two input pulses (1.997 sec) a short output pulse (0.003 sec) is provided, h) and wherein the pulse generator (20) supplies an input signal to a measuring switch (24) via a further output line (23) only during this output pulse, such that in essence the measuring means (25) is activated at the same time in which the heating current switch (10) is interrupted.

2. Controlling means as claimed in claim 1, characterized by a switching means (35) from which the output signal of the temperature comparator (17) is supplied to the pulse generator (20) and which can be interrupted by the output signal of the connection circuit (33) of the measuring means (25) in form of an error signal such that the heating current is switched off.

3. A controlling circuit as claimed in claim 2, characterized in that the measuring section (25) includes a resistor (26) which together with the electrical resistance-type heating element (11) forms a voltage divider while said element is disconnected from the supply voltage source, the divider voltage of said voltage divider being compared with a reference voltage from a reference voltage source (27, 28) in a comparator (31) for providing the output signal (34) from the measuring section (25) such that there occurs an output signal from the measuring section for controlling the switch section for de-energizing the electrical resistance-type heating element when the voltage drop at the electrical resistance-type heating element falls below the reference voltage due to the measuring current.

4. A controlling circuit as claimed in claim 3, characterized in that the divider voltage of the voltage divider (26, 11) which includes the electrical resistance-type heating element (11) is compared in a further comparator (32) with a further reference voltage from another reference voltage source (29, 30) for forming the output signal from the measuring section (25) such that an output signal from the measuring section will occur for controlling the switch section for de-energizing the electrical resistance-type heating element when the voltage drop at the electrical resistance-type heating element due to the measuring current exceeds said further reference voltage.

5. A controlling circuit as claimed in claim 1, characterized in that the resistance (13) which depends on the temperature forms a first member of a bridge circuit together with a series resistance (14), wherein the second member of the bridge circuit is formed by an adjustable resistance (15) and a further resistance (16) which is connected in series thereto, wherein both bridge members are connected to the heat voltage source ($U_B$) and which bridge circuit is connected to the temperature comparator (17) at each of the two points between the co-ordinated resistances, such that the second bridge member (15, 16) forms the reference value for the temperature of the heating element (11).

6. A controlling circuit as claimed in claim 1, characterized in that the switch section (10, 24, 36) is controlled such that the normally short-time breaking of the connection between the electrical resistance-type heating element (11) and the supply voltage has a period of approximately 1/2000 to 1/500 of the period of the signal from the thermostatic control means causing the electrical resistance-type heating element to be turned ON.

* * * * *